United States Patent
Jansson Toftgård et al.

(10) Patent No.: US 10,320,413 B2
(45) Date of Patent: Jun. 11, 2019

(54) METHODS AND DEVICES FOR VECTOR SEGMENTATION FOR CODING

(71) Applicant: Telefonaktiebolaget L M Ericsson (PUBL), Stockholm (SE)

(72) Inventors: Tomas Jansson Toftgård, Uppsala (SE); Volodya Grancharov, Solna (SE); Jonas Svedberg, Luleå (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 651 days.

(21) Appl. No.: 14/421,680

(22) PCT Filed: Nov. 6, 2014

(86) PCT No.: PCT/SE2014/051310
§ 371 (c)(1),
(2) Date: Feb. 13, 2015

(87) PCT Pub. No.: WO2015/069177
PCT Pub. Date: May 14, 2015

(65) Prior Publication Data
US 2016/0065239 A1    Mar. 3, 2016

Related U.S. Application Data

(60) Provisional application No. 61/901,089, filed on Nov. 7, 2013.

(51) Int. Cl.
*H04B 1/66*        (2006.01)
*H04N 7/12*        (2006.01)
(Continued)

(52) U.S. Cl.
CPC .......... *H03M 7/3082* (2013.01); *G06F 17/16* (2013.01); *G10L 19/038* (2013.01);
(Continued)

(58) Field of Classification Search
CPC ... G10L 19/038; H04N 19/124; H04N 19/194
See application file for complete search history.

(56) References Cited

U.S. PATENT DOCUMENTS 6,064,954 A * 5/2000 Cohen ................. G10L 19/0212
704/207
7,310,598 B1 * 12/2007 Mikhael ................ G10L 19/038
704/203

(Continued)

OTHER PUBLICATIONS

ITU-T Recommendation G.719, "Low-complexity full-band audio coding for high-quality conversational applications," ITU-T, 2009.*
International Search Report dated Apr. 7, 2015, in International Application No. PCT/SE2014/051310, 2 pages.
Jégou et al. "Product Quantization for Nearest Neighbor Search" IEEE Transactions on Pattern Analysis and Machine Intelligence, vol. 33, No. 1, 2011, 12 pages.

(Continued)

*Primary Examiner* — Tat C Chio
*Assistant Examiner* — Fabio S Lima
(74) *Attorney, Agent, or Firm* — Rothwell, Figg, Ernst & Manbeck, p.c.

(57) ABSTRACT

A method for partitioning of input vectors for coding is presented. The method comprises obtaining (210) of an input vector. The input vector is segmented (220), in a non-recursive manner, into an integer number, $N^{SEG}$, of input vector segments. A representation of a respective relative energy difference between parts of the input vector on each side of each boundary between the input vector segments is determined (230), in a recursive manner. The input vector segments and the representations of the relative energy differences are provided (250) for individual coding. Partitioning units and computer programs for partitioning of input vectors for coding, as well as positional encoders, are presented.

30 Claims, 7 Drawing Sheets

(51) Int. Cl.
*H04N 11/02* (2006.01)
*H04N 11/04* (2006.01)
*H03M 7/30* (2006.01)
*H04N 19/124* (2014.01)
*H04N 19/192* (2014.01)
*H04N 19/94* (2014.01)
*G06F 17/16* (2006.01)
*G10L 19/038* (2013.01)

(52) U.S. Cl.
CPC ......... *H04N 19/124* (2014.11); *H04N 19/192* (2014.11); *H04N 19/94* (2014.11)

(56) References Cited

U.S. PATENT DOCUMENTS

| 2004/0030548 | A1* | 2/2004 | El-Maleh | G10L 19/002 |
| | | | | 704/230 |
| 2007/0147518 | A1* | 6/2007 | Bessette | G10L 19/0212 |
| | | | | 375/243 |
| 2009/0067617 | A1* | 3/2009 | Trichina | G06F 7/723 |
| | | | | 380/28 |
| 2013/0343616 | A1* | 12/2013 | Forero | G06K 9/00335 |
| | | | | 382/115 |

OTHER PUBLICATIONS

Second Office Action dated Feb. 3, 2019 issued in Chinese Patent Application No. 201480059683.6. (10 pages).

\* cited by examiner

METHODS AND DEVICES FOR VECTOR SEGMENTATION FOR CODING

CROSS REFERENCE TO RELATED APPLICATION(S)

This application is a 35 U.S.C. § 371 National Phase Entry Application from PCT/SE2014/051310, filed Nov. 6, 2014, designating the United States, and also claims the benefit of U.S. Provisional Application No. 61/901,089, filed Nov. 7, 2013. The disclosures of both applications are incorporated herein in their entirety by reference.

TECHNICAL FIELD

The proposed technology generally relates to methods and devices for vector segmentation and in particular to methods, partitioning units, encoders, computer programs, carriers comprising the computer programs and apparatuses for partitioning of input vectors originating from audio/video signals for coding.

BACKGROUND

Examples of positional coding schemes e.g. for encoding of an audio signal are Factorial Pulse Coding (FPC) and Pyramid Vector Quantization (PVQ). A positional coding could result in large codeword indices, especially for a long input vector, because of the rapidly increasing number of combinations by increasing dimensions. For low complexity implementations, a pre-processing step of clustering of the input vector can be used. Another reason for this type of pre-processing can be quantizer restraints. However, a conventional clustering may result in that different parts of the input vector have very different sizes, which could make the positional coding very inefficient. Thus, there is a need to provide an improved pre-processing of the input vector at positional encoding.

SUMMARY

It is an object to provide methods and devices for efficient partitioning of input vectors.

This and other objects are met by embodiments of the proposed technology.

According to a first aspect, there is provided a method for partitioning of input vectors for coding. The method comprises obtaining of an input vector. The input vector is segmented, in a non-recursive manner, into an integer number, $N^{SEG}$, of input vector segments. A representation of a respective relative energy difference between parts of the input vector on each side of each boundary between the input vector segments is determined, in a recursive manner. The input vector segments and the representations of said relative energy differences are provided for individual coding.

According to a second aspect, a partitioning unit is configured to partition input vectors for coding. The partitioning unit is configured to obtain an input vector. The partitioning unit is further configured to segment, in a non-recursive manner, the input vector into an integer number, $N^{SEG}$, of input vector segments. The partitioning unit is also configured to determine, in a recursive manner, a representation of a respective relative energy difference between parts of the input vector on each side of each boundary between the input vector segments. The partitioning unit is further configured to provide the input vector segments and the representations of said relative energy differences for individual coding.

According to a third aspect, an encoder for positional encoding comprises an input unit configured to receive an input vector representing a signal, a partitioning unit according to the first aspect, a quantizer and an output unit for an encoded signal.

According to a fourth aspect, a computer program comprises instructions, which when executed by at least one processor, cause the at least one processor to obtain an input vector, to segment, in a non-recursive manner, the input vector into an integer number, $N^{SEG}$, of input vector segments, to determine, in a recursive manner, a representation of a respective relative energy difference between parts of the input vector on each side of each boundary between the input vector segments, and to provide the input vector segments and the representations of said relative energy differences for individual coding.

According to a fifth aspect, a carrier comprises the computer program of the fourth aspect, wherein the carrier is one of an electronic signal, an optical signal, an electromagnetic signal, a magnetic signal, an electric signal, a radio signal, a microwave signal, or a computer-readable storage medium.

According to a sixth aspect, an apparatus for partitioning of input vectors for coding comprises an obtaining module for obtaining an input vector. The apparatus also comprises a segmenting module for segmenting, in a non-recursive manner, the input vector into an integer number, $N^{SEG}$, of input vector segments. The apparatus further comprises a recursive determining module for determining, in a recursive manner, a representation of a respective relative energy difference between parts of the input vector on each side of each boundary between the input vector segments. The apparatus further comprises a providing module for providing the input vector segments and the representations of said relative energy differences for individual coding.

An advantage of the proposed technology is that input vectors are segmented for efficient coding, in particular positional coding, irrespectively of differing sizes and energy content.

Other advantages will be appreciated when reading the detailed description.

BRIEF DESCRIPTION OF THE DRAWINGS

The embodiments, together with further objects and advantages thereof, may best be understood by making reference to the following description taken together with the accompanying drawings, in which.

DETAILED DESCRIPTION

Throughout the drawings, the same reference designations are used for similar or corresponding elements.

For a better understanding of the proposed technology, it may be useful to begin with a brief overview of some aspects of vector splitting.

Figure 1A:
FIGS. 1A-1B are illustrations of partitioning of input vectors for positional encoding.
Figure 1B:
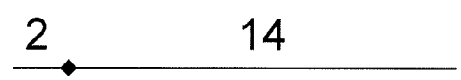

As an example, consider a 16-dim input vector split in two ways, as illustrated in FIGS. 1A and 1B:
A) Symmetric (8+8) and
B) Asymmetric (2+14).

In both case we have 2 pulses to code in each of the segments.

In case there is no overlap, i.e. the pulses cannot occupy same position, and there is no sign to be transmitted, the number of levels to be encoded and transmitted is calculated as n!/k!(n−k)!, where n is the dimension of the segment and k is the number of pulses:
A) 28+28=56 levels
B) 1+91=92 levels In case pulses are allowed to occupy same position, and the sign of the pulses also have to be encoded:
A) 128+128=256 levels
B) 8+392=400 levels In both cases it is obvious that a more symmetric segmentation is more efficient. The proposed technology described hereinafter therefore aims at creating segments of essentially equal size, in order to facilitate efficient coding, preferably positional coding.

A problem associated with a uniform splitting of the input vector is that the energy variation between different parts could be large, which will cause an unstable gain quantization. The proposed technology described hereinafter therefore also aims at determining energy ratios for representing a relative energy difference between the segments.

Embodiments of the proposed technology relate to a non-recursive, uniform split of the input vector into segments, and comprise a recursive calculation of energy ratios of a largest possible dimension for a certain level.

The bits for coding of the created segments may be distributed based on energy, and optionally also based on the lengths of the segments.

Figure 2:
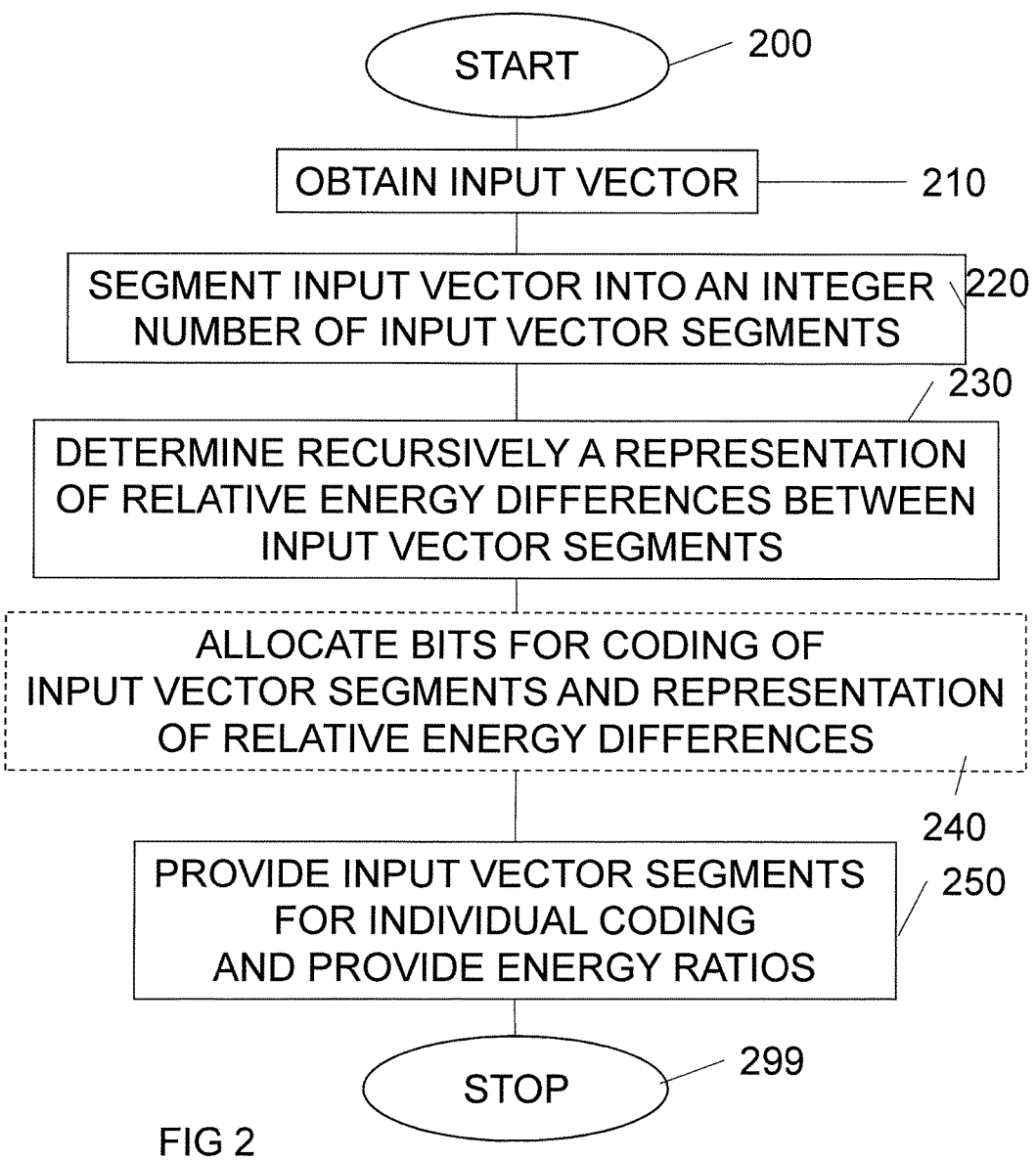
FIG. 2 is a flow diagram of steps of an embodiment of a method for partitioning of input vectors originating from audio/video signals for coding.

FIG. 2 illustrates a flow diagram of steps of an embodiment of a method for partitioning of input vectors for coding, preferably positional coding. Preferably, the input vectors originate from audio signals, but the ideas presented here also operate well for e.g. video signal as well. The process begins in step 200. In step 210, an input vector is obtained. In step 220, the input vector is segmented into an integer number of input vector segments. Preferably, the integer number is the smallest integer number by which each input vector segment fulfils constraints associated with a quantizer for the coding, preferably positional coding. Such constraints associated with a quantizer typically comprises the actual bit constraints of the quantizer. However, the constraints associated with a quantizer may also comprise adjustments of the effective bitrate cost for representing relative energy differences when segmenting said input vector into several input vector segments. In other words, the number of input vector segments, preferably the minimum number of input vector segments, is determined, where each individual input vector segment is small enough to be processed by the coding, preferably positional coding, to follow. This integer number of input vector segments is denoted $N^{SEG}$. This segmentation is performed in a non-recursive manner. In step 230, a representation of a respective relative energy difference between parts of the input vector on each side of each boundary between the input vector segments is determined. This is on the other hand performed in a recursive manner.

In a particular embodiment, the bits for coding of the created segments may be distributed based on energy, and optionally also based on the lengths of the segments. In such an embodiment, and therefore illustrated by a dotted box, the method may comprise the further step 240 of allocating bits for coding of each input vector segment and coding of a representation of relative energy differences between the level segments.

According to the main embodiment, in step 250, the input vector segments are provided for individual coding, preferably positional coding, together with representations of the energy ratios. The process ends in step 299.

Expressed in a more mathematical manner, an embodiment of the segmentation can be described as follows. With a length L of an input vector, a total bit-budget for quantizing this vector $B^{TOT}$, and quantizer constraints (e.g. maximum allowed bits per quantizer/segment $Q^{MAX}$) the number of segments be calculated as:

$$N^{SEG} = \left\lceil \frac{B^{TOT}}{Q^{MAX}} \right\rceil$$

If $\lceil \cdot \rceil$ is the ceiling function, the quantity $N^{SEG}$ represents the smallest number of input vector segments that still can be processed by the intended quantizer. In other words, $N^{SEG}$ is a smallest possible integer number of input vector segments, by which each input vector segment fulfils constraints of a quantizer for the coding, preferably positional coding. In particular embodiments, the quantizer constraints may be based on the quantity $Q^{MAX}$ and an adjustment term reflecting the effective bitrate cost for representing relative energy differences when splitting the input vector into several input vector segments.

The length of a segment can be obtained as:

$$L^{SEG} = \frac{L}{N^{SEG}}$$

If the input vector cannot be divided into equal input vector segments, then:

$$L^{SEG} = \left\lfloor \frac{L}{N^{SEG}} \right\rfloor,$$

where $\lfloor \cdot \rfloor$ is the floor function.

The remaining coefficients $L - L^{SEG} N^{SEG}$ can be distributed to the segments in several ways, e.g. all included in the last segment or sequentially to each segment until there are no more remaining coefficients. It is thus preferred to keep a large majority of the segments to be more or less of the same size. In other words, at least $N^{SEG}-1$ of the input vector segments have a respective length differing by less than 1.

In one particular embodiment, all remaining coefficients are included in the last segment, i.e. the first $N^{SEG}-1$ input vector segments have identical lengths. In another particular embodiment, the remaining coefficients are distributed sequentially to each segment until there are no more remaining coefficients. The different input vector segments will thus differ in length with at most one unit. In other words, all input vector segments having lengths not differing by more than 1.

In one embodiment, after a segmenting of the input vector, the shape vector of each segment is quantized. The gain is excluded, e.g. assuming a root-mean-square value of one. Energy ratios describing the relative energy differences between the segments are determined, quantized, and used to scale the quantized shape vectors such as the shape of the input vector is preserved. The energy ratios are calculated recursively from lower to higher resolution, and in the most symmetrical way. This will be described by examples in connection with FIGS. 3-6.

In the examples, the segments are characterized by its number of bits $B_x^{SEG}$ used for representing the segment. In FIGS. 3-6, these numbers of bits are also used for denoting the segments themselves. A segment $B_0^{SEG}$ should therefore be understood as the segment being coded by the $B_0^{SEG}$ bits. Likewise, the representation of a relative energy difference is characterized by the bits, e.g. $B_0^E$, used for coding that difference.

Figure 3:
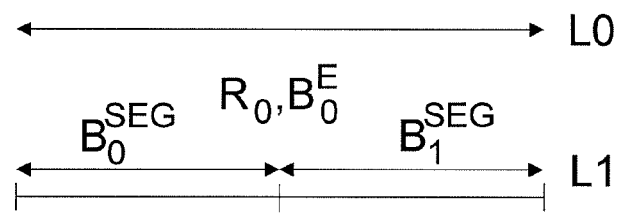
FIGS. 3-6 are illustrations of a recursive process for determining a representation of a respective relative energy difference between parts of an input vector.

In FIG. 3, a situation where the input vector is determined to be partitioned into two segments is illustrated. The input vector of level 0, L0, is split in two segments $B_0^{SEG}$ and $B_1^{SEG}$ of level 1, L1. A trivial case of energy ratio $R_0$, and a representation $B_0^E$ of a relative energy difference is provided on one level between those segments.

Figure 4:
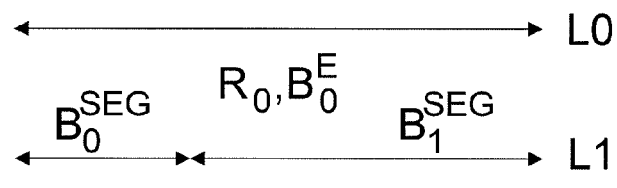
Figure 4:
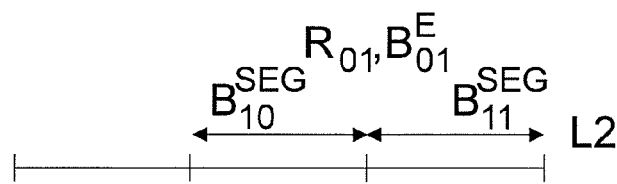

In FIG. 4, a situation where the input vector is determined to be split into three segments is illustrated. Energy ratios are provided on two levels, with the first one being asymmetric due to odd number of segments. More in detail, the input vector of level 0, L0, is split in two segments $B_0^{SEG}$ and $B_1^{SEG}$ of level 1, L1. The segment $B_1^{SEG}$, or rather the segment to be coded by the $B_1^{SEG}$ bits, is here including two of the segments the input vector is partitioned into, the input vector segments, while the segment $B_0^{SEG}$ is including one of the input vector segments. An energy ratio $R_0$, and a representation $B_0^E$ of a relative energy difference is provided on level L1 between those segments, $B_0^{SEG}$ and $B_1^{SEG}$. The segment $B_1^{SEG}$ is subsequently handled as a new upper level input vector of level L1 and is in turn split in two segments $B_{10}^{SEG}$ and $B_{11}^{SEG}$ of level 2, L2. Now, the segments $B_{10}^{SEG}$ and $B_{11}^{SEG}$ include an equal number of the input vector segments. An energy ratio $R_{01}$, and a representation $B_{01}^E$, of a relative energy difference is provided on level L2 between those segments, $B_{10}^{SEG}$ and $B_{11}^{SEG}$.

Figure 5:
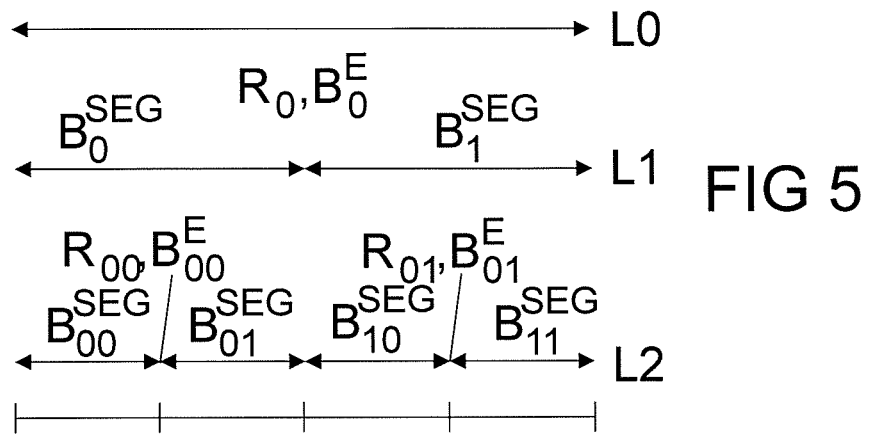

In FIG. 5, a situation where the input vector is determined to be split into four segments is illustrated. The energy ratios are here symmetrical in two levels. More in detail, the input vector of level 0, L0, is split in two segments $B_0^{SEG}$ and $B_1^{SEG}$ of level 1, L1. The segments $B_1^{SEG}$ and $B_0^{SEG}$ are here including an equal number of input vector segments. An energy ratio $R_0$, and a representation $B_0^E$ of a relative energy difference is provided on level L1 between those segments, $B_0^{SEG}$ and $B_1^{SEG}$. The segment $B_0^{SEG}$ is subsequently handled as a new upper level input vector of level L1 and is in turn split in two segments $B_{00}^{SEG}$ and $B_{01}^{SEG}$ of level 2, L2. The segments $B_{00}^{SEG}$ and $B_{01}^{SEG}$ are including an equal number of the input vector segments. An energy ratio $R_{00}$, and a representation $B_{00}^E$ of a relative energy difference is provided on level L2 between those segments, $B_{00}^{SEG}$ and $B_{01}^{SEG}$. The segment $B_1^{SEG}$ is also subsequently handled as a new upper level input vector of level L1 and is in turn split in two segments $B_{10}^{SEG}$ and $B_{11}^{SEG}$ of level 2, L2. Now, the segments $B_{10}^{SEG}$ and $B_{11}^{SEG}$ are including an equal number of the input vector segments. An energy ratio $R_{01}$, and a representation $B_{01}^E$ of a relative energy difference is provided on level L2 between those segments, $B_{10}^{SEG}$ and $B_{11}^{SEG}$.

Figure 6:
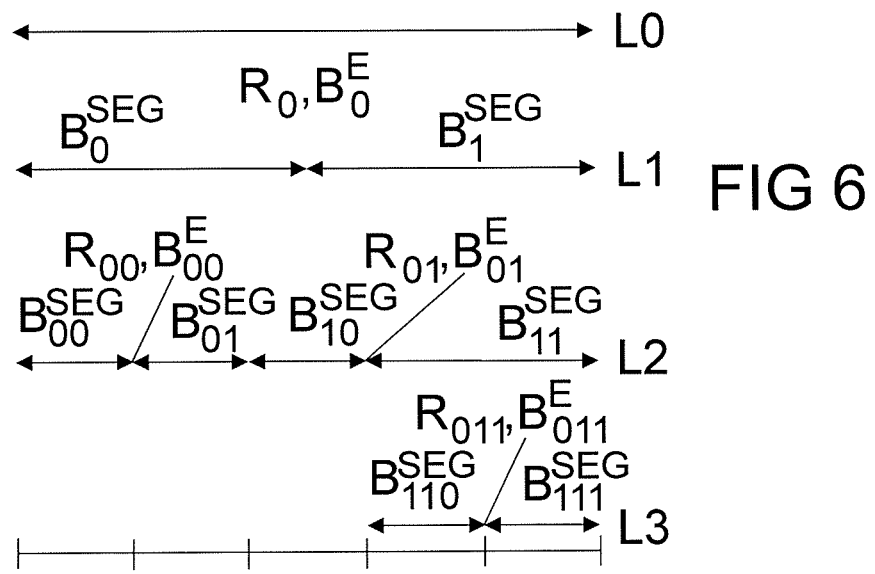

In FIG. 6, a situation where the input vector is determined to be split into five segments is illustrated. Here the energy ratios are calculated on three levels. More in detail, the input vector of level 0, L0, is split in two segments $B_0^{SEG}$ and $B_1^{SEG}$ of level 1, L1. The segments $B_1^{SEG}$ and $B_0^{SEG}$ are here not including an equal number of the input vector segments. An energy ratio $R_0$, and a representation $B_0^E$ of a relative energy difference is provided on level L1 between those segments, $B_0^{SEG}$ and $B_1^{SEG}$. The segment $B_0^{SEG}$ is subsequently handled as a new upper level input vector of level L1 and is in turn split in two segments $B_{00}^{SEG}$ and $B_{01}^{SEG}$ of level 2, L2. The segments $B_{00}^{SEG}$ and $B_{01}^{SEG}$ are including an equal number of the input vector segments. An energy ratio $R_{00}$, and a representation $B_{00}^E$ of a relative energy difference is provided on level L2 between those segments, $B_{00}^{SEG}$ and $B_{01}^{SEG}$. The segment $B_1^{SEG}$ is also subsequently handled as a new upper level input vector of level L1 and is in turn split in two segments $B_{10}^{SEG}$ and $B_{11}^{SEG}$ of level 2, L2. The segments $B_{10}^{SEG}$ and $B_{11}^{SEG}$ are not including an equal number of the input vector segments. An energy ratio $R_{01}$, and a representation $B_{01}^E$ of a relative energy difference is provided on level L2 between those segments, $B_{10}^{SEG}$ and $B_{11}^{SEG}$. The segment $B_{11}^{SEG}$ here comprises more than one final segment, and is consequently causing another level of energy ratio calculations. The segment $B_{11}^{SEG}$ is therefore handled as a new upper level input vector of level L2 and is in turn split in two segments $B_{110}^{SEG}$ and $B_{111}^{SEG}$ of level 3, L3. The segments $B_{110}^{SEG}$ and $B_{111}^{SEG}$ are including an equal number of the input vector segments. An energy ratio $R_{011}$, and a representation $B_{011}^E$ of a relative energy difference is provided on level L3 between those segments, $B_{110}^{SEG}$ and $B_{111}^{SEG}$. Now, all segments are divided.

From the series of figures above, it can be seen that the input vector is set as an upper level input vector, originally at level L0. Then, in order to split the input vector in two parts, a center boundary between input vector segments is to be found. The upper level input vector is thereby dividing at the found center boundary, into two "level segments", or lower level input vectors. If the input vector can be split into two equally large parts, the boundary is found at the center. If the input vector has to be split into two unequally large parts, e.g. caused by an uneven number of segments or segments of differing sizes, the boundary closest on a first side to the center of the upper level input vector is preferably selected. In the embodiment of FIGS. 3-6, the boundary at the left side is selected. In other words, if the upper level input vector has to be divided into non-equally sized lower level input vectors, the center boundary is selected as the boundary closest to the center of the upper level input vector giving a larger last (right) lower level input vector than first (left) lower level input vector.

A representation of a relative energy difference between the two lower level input vectors is calculated. If at least one of the two lower level input vectors comprise more than one vector segment, the procedure is repeated, but now with the lower level input vectors, comprising more than one input vector segment, used as upper level input vectors. The whole process continues until all boundaries between input vector segments are provided with an associated representation of a relative energy difference, at some level.

Note that the division into segments is performed non-recursively in a first stage. In a second stage, the energy differences are determined in a recursive manner.

Figure 7:
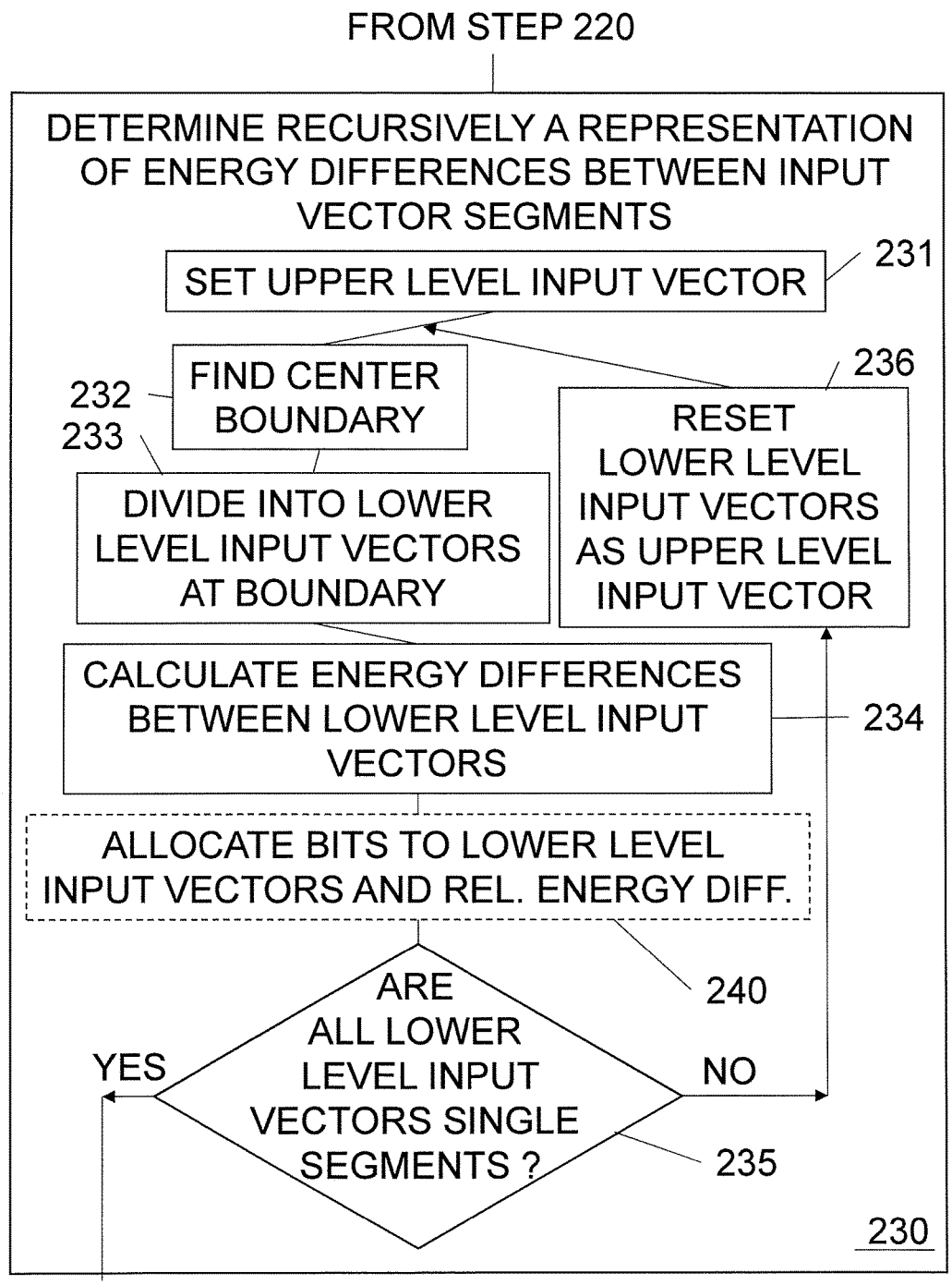
FIG. 7 is a flow diagram of steps of an embodiment of a step of recursively determining a representation of a respective relative energy difference between parts of an input vector.

FIG. 7 illustrates a flow diagram of substeps of an embodiment of a step 230 for recursively determining a representation of energy differences between input vector segments. The flow starts from step 220 of FIG. 2. In step 231, the input vector is set as an upper level input vector. In step 232, a center boundary is found. The center boundary is the boundary between input vector segments being at or closest on a first side to a center of the upper level input vector. In step 233, the upper level input vector is divided at the center boundary into two lower level input vectors. In step 234, a representation of a relative energy difference between the two lower level input vectors is calculated. In step 235 it is determined whether or not all lower level input vectors consists of single segments. All lower level input vectors consists of single segments when all boundaries between input vector segments are provided with an associated representation of a relative energy difference. If there are remaining lower level input vectors comprising more than one segment, the flow continues to step 236, where the lower level input vectors are reset as new upper level input vectors. The process then continues from step 232, repeating the finding, dividing and calculating if necessary. The steps 232, 233 and 234 are not performed for any upper level input vectors comprising one segment, i.e. not encapsulating any boundary at all.

If, in step 235, it is concluded that all lower level input vectors consists of single input vector segments, the flow continues to step 250 or 240.

The average number of bits per segment would according to the discussion further above be:

$$B^{SEG}=B^{TOT}/N^{SEG}$$

In a particular embodiment, the average bits per-segment calculated above is just an initial estimation that can be re-adjusted after calculating the energy ratios between neighboring segments. The bits for coding of the created segments may be distributed based on energy, and based on the lengths of the segments. Bits can be transferred from segments with lower energy towards segments with higher energy. At the same time the size $L^{SEG}$ and the segment boundaries are not affected. This is illustrated e.g. as step 240 in FIG. 2, which shows a general allocation of bits for coding of each input vector segment and coding of a representation of relative energy differences between the segments, both input vector segments and level segments.

As indicated in FIG. 7, the step 240 of allocating bits for coding of each input vector segment and coding of a representation of relative energy differences between the level segments may also be included as a recursive process in a hierarchic structure. In other words, the allocation of bits can be performed concurrently to the deter mining, in a recursive manner, of a representation of a respective relative energy difference. With reference to the embodiment illustrated by FIG. 7, it is seen that the step of allocating bits for coding of each input vector segments and coding of a representation of relative energy differences between the level segments is performed in connection to the calculation of the representation of relative energy differences.

The hierarchical energy ratio coding can be used to distribute the bits recursively to the already determined segments. In the upper level, level L0, the total number of bits $B^{TOT}$ are divided into energy ratio bits $B^E$ and segment bits $B^{SEG}$ for the lower level, level L1, such that $$B^{TOT}=B^E+B^{SEG},$$

with $$B^{SEG}=B_0^{SEG}+B_1^{SEG}$$

where $B_0^{SEG}$ and $B_1^{SEG}$ are the allocated bits for the left and right level segments, respectively, or in terms of the above description, the first and last lower level input vector in level L1.

This is repeated for each level, in that sense that at each level, the bits allocated to the first and last lower level input vector are, in case lower level input vector encapsulates more than one input vector segment, split into bits for coding the representation of the relative energy difference and bits for coding the respective first and last lower level input vector.

If the subsequent layer segment, i.e. lower level input vector consists of one single cluster or segment the assigned segment bits $B^{SH}$ will be allocated the shape coding, i.e. for example the second level of FIG. 4 where $B^{SH}=B_0^{SEG}$.

The level segment bits $B^{SEG}$ are preferably distributed to the first level segments, i.e. the lower level input vectors (that consists of one or several segments from the clustering of the input vector) based on the energy ratio between these level segments or lower level input vectors. In general, the step of allocating bits allocates bits for the lower level input vectors in dependence of a ratio between the number of coefficients of the lower level input vectors and a relation between the energies in the lower level input vectors. The difference $\varphi$ in bits per coefficient between the level segments is:

$$\varphi = \frac{B_1^{SEG}}{L_1^{SEG}} - \frac{B_0^{SEG}}{L_0^{SEG}}, \tag{1}$$

which with a half bit per log 2 energy difference is:

$$\varphi = \frac{1}{2}(\log_2(E_1) - \log_2(E_0)) = \frac{1}{2}\log_2(R_0), \tag{2}$$

where $E_0$ and $E_1$ are the energies of the left and right level segments, i.e. the first and last lower level input vector, respectively. The energy ratio $R_0$ can equivalently be expressed in terms of an angle $\alpha$ as:

$$R_0=\tan^2 \alpha,$$

where $$\alpha = \arctan\sqrt{\frac{E_1}{E_0}}.$$

This means that the number of bits for each level segment is:

$$B_0^{SEG} = \frac{B^{SEG} - \varphi L_1^{SEG}}{1 + \frac{L_1^{SEG}}{L_0^{SEG}}}$$

$$= \frac{B^{SEG} - \frac{1}{2}\log_2(R_0)L_1^{SEG}}{1 + \frac{L_1^{SEG}}{L_0^{SEG}}}$$

$$= \frac{B^{SEG} - \log_2(\tan(\alpha))L_1^{SEG}}{1 + \frac{L_1^{SEG}}{L_0^{SEG}}}$$

$$B_1^{SEG} = B^{SEG} - B_0^{SEG}$$

Depending on the input vector length L and the number of clusters (segments) $N^{SEG}$, the clusters may not be equally large. This also causes some of the lower level input vectors to be of differing size. Also if the number of clusters or segments is different from 2n, some lower level input vectors will be of differing size. The differing size of the input vector segments will also have a negative impact on the shape coding in the bands that are larger, due to coding, e.g. positional coding. In order to compensate for the different sized bands the difference in bits per coefficient, cf. eq. (1) can be compensated such that:

$$\left(\frac{B_1^{SEG}}{L_1^{SEG}} + f_1\right) - \left(\frac{B_0^{SEG}}{L_0^{LEG}} + f_0\right) = \varphi, \quad (3)$$

where the compensation factors $f_i$ may for example be a function $f_i = F(N^{SEG}, B^{SEG}, L_i^j)$ of the cluster lengths $L_i^j$, where j is the cluster index $(0, \ldots, N^{SEG}-1)$, the number of segments $N^{SEG}$ and the segment bits $B^{SEG}$. In other words, the compensation factors may be dependent on lengths of input vector segments, the number of input vector segments within the both lower level input vectors and bits allocated for both lower level input vectors. Combining eq. (2) and (3) gives the relations:

$$B_0^{SEG} = \frac{B^{SEG} + (f_1 + f_0)L_1^{SEG} - \frac{1}{2}\log_2(R_0)L_1^{SEG}}{1 + \frac{L_1^{SEG}}{L_0^{SEQ}}}$$

$$B_1^{SEG} = B^{SEG} - B_0^{SEG}$$

where $B^{SEG}$ is the sum of allocated bits for both lower level input vectors excluding the bits allocated for coding of a representation of a relative energy difference between the lower level input vectors, $B_0^{SEG}$ is the allocated bits for the first lower level input vector, $L_0^{SEG}$ and $L_1^{SEG}$ are the lengths of the first and last lower level input vectors, respectively, $R_0$ represents the ratio between the energies in the lower level input vectors and $f_0$ and $f_1$ are compensation factors for differing lengths of input vector segments within the first and last lower level input vectors, respectively. The compensation factors $f_0$ and $f_1$ are defined such that they become zero for equal lengths of the input vector segments within the first and last lower level segments, respectively.

In one embodiment, the shapes are quantized with a pulse quantizer such as the PVQ. The compensation factors are based on the average bits per segment and the difference between segment lengths and the minimum segment length. In other words, the compensation factors are dependent on at least average bits per input vector segment within the first and last lower level input vectors, respectively, the input vector segment lengths within the first and last lower level input vectors, respectively, and a minimum input vector segment length.

This can be expressed as:

$$f_i = \sum_j \left(F\left(\frac{B^{SEG}}{N^{SEG}}, L_{MIN}, L_i^j\right)\right),$$

where $B^{SEG}$ is the sum of allocated bits for both lower level input vectors and $N^{SEG}$ is the total number of vector segments within both lower level input vectors.

The function $F(\cdot)$ is defined such that it becomes zero when a cluster is of length $L_{MIN}$. This means that $f_i$ becomes zero when all clusters in the corresponding level segment are of length $L_{MIN}$.

In this embodiment, when the remaining coefficients in the clustering, i.e. partitioning of the input vector, $L-L^{SEG}$ $N^{SEG}$ where $N^{SEG}$ denotes the total number of vector segments, are given to the last cluster only, the compensation factor $f_0$ becomes zero as all the clusters j are of length $L_{MIN}$. Additionally, as all clusters except the last one, denoted $N_1^{SEG}-1$, are of length $L_{MIN}$, the factor $f_1$ becomes:

$$f_1 = F\left(\frac{B^{SEG}}{N^{SEG}}, L_{MIN}, L_1^{N_1^{SEG}-1}\right).$$

The function $F(\cdot)$ is in the embodiment defined as:

$$F\left(\frac{B^{SEG}}{N^{SEG}}, L_{MIN}, L_1^{N_1^{SEG}-1}\right) = \frac{B^{SEG}}{N^{SEG}} - G_2\left(L_{MIN}, G_1\left(L_i^{N_1^{SEG}-1}, \frac{B^{SEG}}{N^{SEG}}\right)\right),$$

where the function $G_1(\cdot)$ gives the number of unit pulses that giving the vector length $L_i^{N_1^{SEG}-1}$, can be represented using $$\frac{B^{SEG}}{N^{SEG}}$$

bits. The function $G_2(\cdot)$ gives the number of bits used to represent the by the function $G_1(\cdot)$ determined number of pulses, but for the lower dimension $L_{MIN}$.

In low complex implementations the complexity of $G_1(\cdot)$ and $G_2(\cdot)$ can be reduced by using approximations or sub-samples lookup tables.

In another embodiment, the compensation factors are also dependent on at least average bits per input vector segment within the first and last lower level input vectors, respectively, the input vector segment lengths and a minimum input vector segment length.

$$f_i = \sum_j -\frac{1}{L_i^{SEG}}\left(\frac{B^{SEG}}{N^{SEG}} - G_2\left(\min(L_i^j), G_1\left(L_i^j, \frac{B^{SEG}}{N^{SEG}}\right)\right)\right),$$

-continued $$L_i^{SEG} = \sum_j L_i^j,$$

where $B^{SEG}$ is the sum of allocated bits for both lower level input vectors and $N^{SEG}$ is the total number of vector segments within both lower level input vectors.

Due to the hierarchical structure of the energy ratios, a parent energy ratio may be used to control the bits $B^E$ that are used for coding the child energy ratio. In case the parent energy ratio indicates low energy for the current segment, $B^E$ may be reduced or limited and the saved bits can be redistributed to the shape vector coding using $B^{SH}$ number of bits.

Further, if the positional vector quantizer, e.g. a complexity optimized PVQ pulse vector quantizer implementation, is a variable rate quantizer, the bits occasionally saved or spent (exceeded) by the variable rate quantizer for each segment may be incorporated and used to update the remaining segments, including its compensation factors.

Thus, in a case of coding, preferably positional coding, of large vectors, or high-bitrate coding, e.g. high-bitrate positional coding, the input vector may be pre-processed, comprising a partitioning (i.e. clustering or segmentation) prior to the actual quantization. An advantage with embodiments described herein is that they offer a lightweight solution for partitioning the input vector in an optimal way for a positional quantizer. Embodiments also compensate for the case when optimal partitioning is not possible, by adjustment of the allocated bits.

The proposed technology provides a partitioning unit configured to partition input vectors for coding, preferably positional coding, wherein partitioning unit is configured to obtain an input vector. Preferably, the partitioning unit is intended for audio signals. However, the ideas presented here also operate well for e.g. video signal as well. The partitioning unit is further configured to segment, in a non-recursive manner, the input vector into an integer number, $N^{SEG}$, of input vector segments. The partitioning unit is configured to determine, in a recursive manner, a representation of a respective relative energy difference between parts of the input vector on each side of each boundary between the input vector segments. The partitioning unit is also configured to provide the input vector segments and representations of the relative energy differences for individual coding, preferably positional coding.

It will be appreciated that the methods and devices described herein can be combined and re-arranged in a variety of ways.

For example, embodiments may be implemented in hardware, or in software for execution by suitable processing circuitry, or a combination thereof.

The steps, functions, procedures, modules and/or blocks described herein may be implemented in hardware using any conventional technology, such as discrete circuit or integrated circuit technology, including both general-purpose electronic circuitry and application-specific circuitry.

Figure 8:
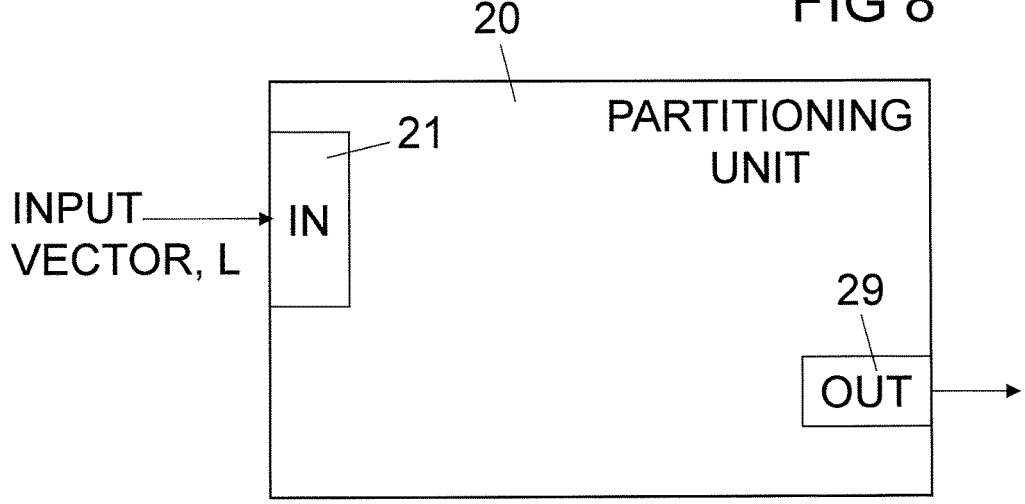
FIG. 8 is a block diagram of an embodiment of a partitioning unit.

Particular examples include one or more suitably configured digital signal processors and other known electronic circuits, e.g. discrete logic gates interconnected to perform a specialized function, or Application Specific Integrated Circuits (ASICs). One embodiment of a partitioning unit 20 is illustrated in FIG. 8. An input vector of length L is obtained through an input section 21. The partitioning unit 20 is configured to provide input vector segments and representations of energy ratios according to the description here above. The input vector segments, together with representation of a respective relative energy difference between parts of the input vector on each side of each boundary between the input vector segments, are provided for individual coding, preferably individual positional coding, through the output section 29.

Alternatively, at least some of the steps, functions, procedures, modules and/or blocks described herein may be implemented in software such as a computer program for execution by suitable processing circuitry such as one or more processors or processing units.

The flow diagram or diagrams presented herein may therefore be regarded as a computer flow diagram or diagrams, when performed by one or more processors. A corresponding apparatus may be defined as a group of function modules, where each step performed by the processor or processors corresponds to a function module. In this case, the function modules are implemented as a computer program running on the processor(s).

Figure 9:
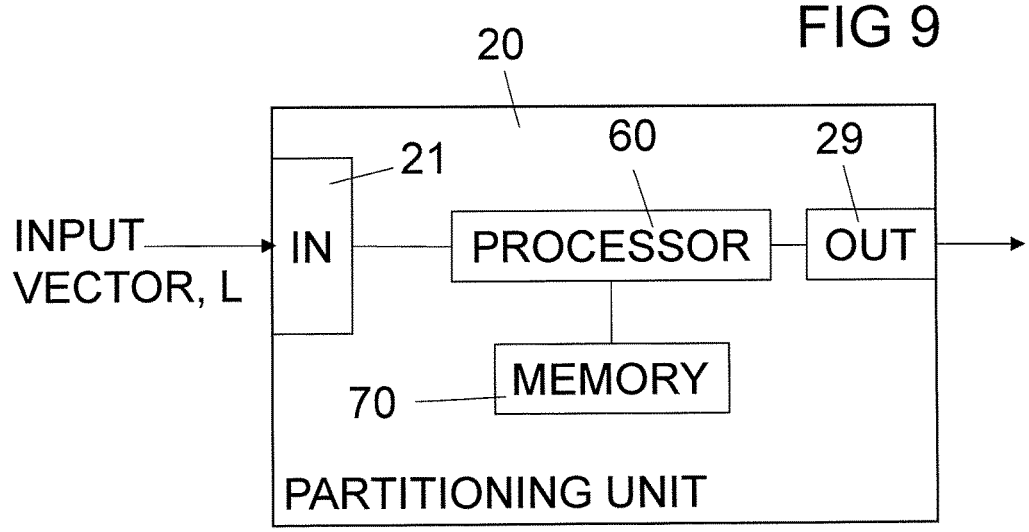
FIG. 9 is a block diagram of another embodiment of a partitioning unit.

In particular, as illustrated in FIG. 9, the partitioning unit 20 may comprise a processor 60 and a memory 70. The memory 70 comprises instructions executable by the processor 60, whereby the processor 60 is operative to obtain an input vector, to segment the input vector into an integer number, $N^{SEG}$, of input vector segments, to determine, in a recursive manner, a representation of a respective relative energy difference between parts of the input vector on each side of each boundary between the input vector segments; and to provide the input vector segments and representations of the relative energy differences for individual coding, preferably individual positional coding.

Examples of processing circuitry includes, but is not limited to, one or more microprocessors, one or more Digital Signal Processors (DSPs), one or more Central Processing Units (CPUs), video acceleration hardware, and/or any suitable programmable logic circuitry such as one or more Field Programmable Gate Arrays (FPGAs), or one or more Programmable Logic Controllers (PLCs).

It should also be understood that it may be possible to re-use the general processing capabilities of any conventional device or unit in which the proposed technology is implemented. It may also be possible to re-use existing software, e.g. by reprogramming of the existing software or by adding new software components.

In the particular example of FIG. 9, at least some of the steps, functions, procedures, modules and/or blocks described herein are implemented in a computer program, which is loaded into the memory for execution by processing circuitry including one or more processors. The processor(s) and memory are interconnected to each other to enable normal software execution. An optional input/output device may also be interconnected to the processor(s) and/or the memory to enable input and/or output of relevant data such as input parameter(s) and/or resulting output parameter(s).

The term 'processor' should be interpreted in a general sense as any system or device capable of executing program code or computer program instructions to perform a particular processing, determining or computing task.

The processing circuitry including one or more processors is thus configured to perform, when executing the computer program, well-defined processing tasks such as those described herein.

The processing circuitry does not have to be dedicated to only execute the above-described steps, functions, procedure and/or blocks, but may also execute other tasks.

In a particular embodiment, the input vector segments have identical lengths or a respective length differing by not more than $N^{SEG}-1$.

In a particular embodiment, the first $N^{SEG}-1$ input vector segments have identical lengths.

In a particular embodiment, all input vector segments have lengths not differing by more than 1.

In a particular embodiment, the partitioning unit is configured to perform the determining, in a recursive manner, of a representation of a respective relative energy difference, by setting the input vector as an upper level input vector, by finding a center boundary, if any, between input vector segments being at or closest on a first side to a center of the upper level input vector, by dividing the upper level input vector at the center boundary, if any, into two lower level input vectors, by calculating a representation of a relative energy difference between the two lower level input vectors if the center boundary exists, and by repeating the finding, dividing and calculating by re-setting the lower level input vectors as a respective upper level input vector, until all boundaries between input vector segments are provided with an associated representation of a relative energy difference.

In a particular embodiment, the partitioning unit is configured to, if the upper level input vector has to be divided into non-equally sized lower level input vectors, select the center boundary as the boundary closest to the center of the upper level input vector giving a larger last lower level input vector than first lower level input vector.

In a particular embodiment, the partitioning unit is further configured to allocate bits for coding of each input vector segments and coding of a representation of relative energy differences between the segments.

In a particular embodiment, the partitioning unit is configured to perform the allocation of bits concurrently to the determining, in a recursive manner, of a representation of a respective relative energy difference.

In a particular embodiment, the partitioning unit is further configured to allocate bits for coding of each the input vector segments performed in connection to the calculating of a representation of a relative energy difference.

In a particular embodiment, the partitioning unit is configured to perform the allocation of bits by allocating bits for the lower level input vectors in dependence of a ratio between lengths of the lower level input vectors and a ratio between the energies in the lower level input vectors.

In a particular embodiment, the partitioning unit is configured to perform the allocation of bits by allocating bits for the lower level input vector according to the equations presented further above.

In a particular embodiment, the compensation factors are dependent on lengths of input vector segments, the number of input vector segments within lower level input vectors and bits allocated for both lower level input vectors.

In a particular embodiment, the compensation factors are dependent on at least average bits per input vector segment, the input vector segment lengths and a minimum input vector segment length.

The partitioning unit typically constitutes a part of an encoder. One embodiment applies to an encoder, preferably an encoder for positional coding, as illustrated in FIG. 10.

Figure 10:
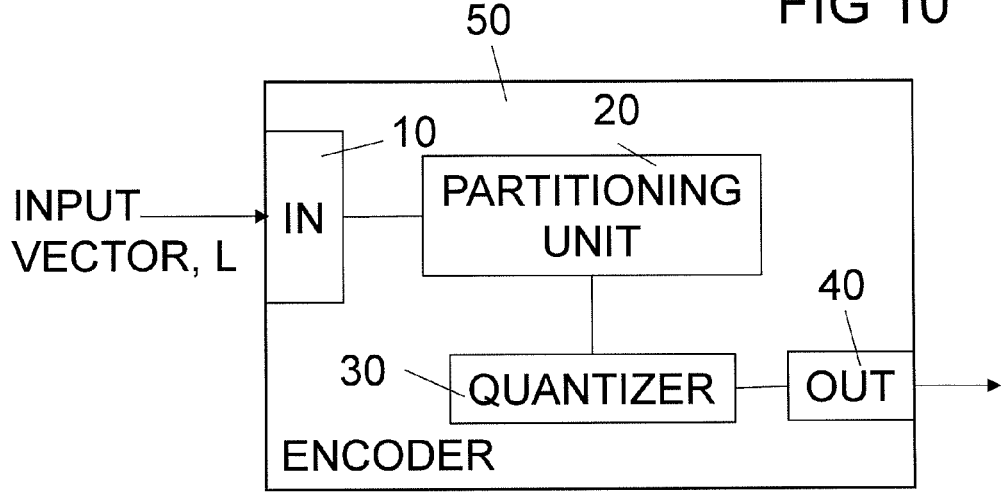
FIG. 10 is a block diagram of an embodiment of a positional encoder.

Thus, FIG. 10 is a schematic block diagram of a positional encoder 50 according to embodiments. The encoder comprises an input unit 10 configured to receive an input vector oft length L, a partitioning unit 20, a positional quantizer 30, and an output unit 40 for the encoded audio signal. Preferably, the encoder is configured for positional encoding of audio signals, i.e. where the input vector represents an audio signal to be encoded. However, the ideas presented here also operate well for e.g. video signal as well.

The positional encoder 50 with its included units could be implemented in hardware. There are numerous variants of circuitry elements that can be used and combined to achieve the functions of the units of the encoder. Such variants are encompassed by the embodiments. Particular examples of hardware implementation of the encoder are implementation in digital signal processor (DSP) hardware and integrated circuit technology, including both general-purpose electronic circuitry and application-specific circuitry.

Figure 11:
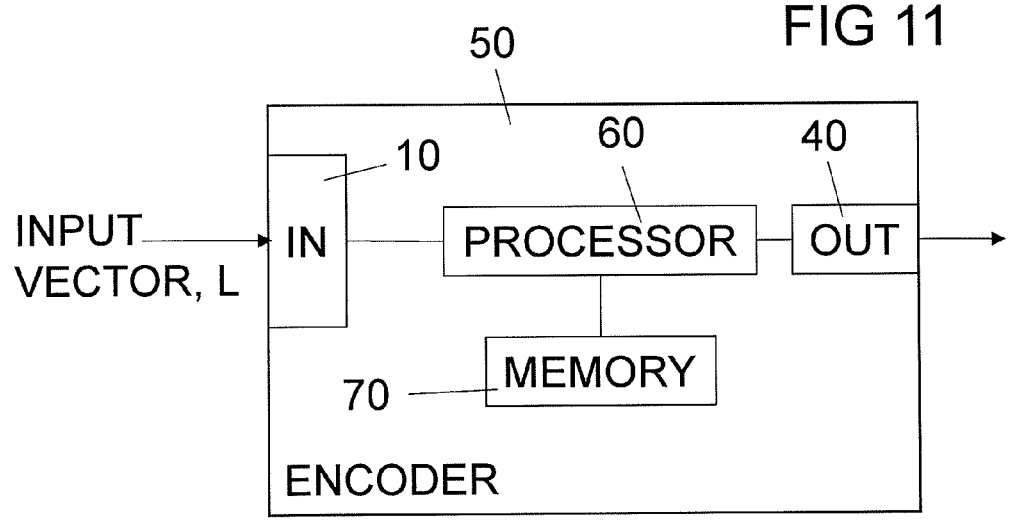
FIG. 11 is a block diagram of another embodiment of a positional encoder.

The positional encoder described herein could alternatively, as illustrated in FIG. 11, be implemented e.g. by one or more of a processor 60 and adequate software with suitable storage or memory 70 therefore, in order to perform the partitioning of an input vector, according to the embodiments described herein. The incoming vector is received by an input (IN) 10, to which the processor 60 and the memory 70 are connected, and the encoded signal obtained from the software is outputted from the output (OUT) 40.

In one embodiment, an encoder for positional encoding comprises an input unit configured to receive an input vector, a partitioning unit according to any of the embodiments presented further above, a quantizer and an output unit for an encoded signal.

In a particular embodiment, a computer program comprises instructions, which when executed by at least one processor, cause the processor(s) to obtain an input vector, to segment, in a non-recursive manner, the input vector into an integer number, $N^{SEG}$, of input vector segments. The instructions, when executed by the processor, causes the processor to further determine, in a recursive manner, a representation of a respective relative energy difference between parts of the input vector on each side of each boundary between the input vector segments, and to provide the input vector segments and representations of the relative energy differences for individual coding, preferably positional coding.

The proposed technology also provides a carrier comprising the computer program, wherein the carrier is one of an electronic signal, an optical signal, an electromagnetic signal, a magnetic signal, an electric signal, a radio signal, a microwave signal, or a computer-readable storage medium.

By way of example, the software or computer program may be realized as a computer program product, which is normally carried or stored on a computer-readable medium, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

In a particular embodiment, a carrier comprises the computer program mentioned further above, wherein the carrier is one of an electronic signal, an optical signal, an electromagnetic signal, a magnetic signal, an electric signal, a radio signal, a microwave signal, or a computer-readable storage medium.

The technology described above may be used e.g. in a sender, which can be used in a mobile device (e.g. mobile phone, laptop) or a stationary device, such as a personal computer. The proposed technology may be applied to a user terminal, which may be a wired or wireless device.

As used herein, the non-limiting terms "User Equipment" and "wireless device" may refer to a mobile phone, a cellular phone, a Personal Digital Assistant, PDA, equipped with radio communication capabilities, a smart phone, a laptop or Personal Computer, PC, equipped with an internal or external mobile broadband modem, a tablet PC with radio communication capabilities, a target device, a device to device UE, a machine type UE or UE capable of machine to machine communication, iPAD, customer premises equipment, CPE, laptop embedded equipment, LEE, laptop mounted equipment, LME, USB dongle, a portable electronic radio communication device, a sensor device equipped with radio communication capabilities or the like. In particular, the term "UE" and the term "wireless device" should be interpreted as non-limiting terms comprising any type of wireless device communicating with a radio network node in a cellular or mobile communication system or any device equipped with radio circuitry for wireless communication according to any relevant standard for communication within a cellular or mobile communication system.

As used herein, the term "wired device" may refer to any device configured or prepared for wired connection to a network. In particular, the wired device may be at least some of the above devices, with or without radio communication capability, when configured for wired connection.

It is to be understood that the choice of interacting units or modules, as well as the naming of the units are only for exemplary purpose, and may be configured in a plurality of alternative ways in order to be able to execute the disclosed process actions.

The flow diagram or diagrams presented herein may therefore be regarded as a computer flow diagram or diagrams, when performed by one or more processors. A corresponding partitioning unit or positional encoder may be defined as a group of function modules, where each step performed by the processor corresponds to a function module. In this case, the function modules are implemented as a computer program running on the processor. Hence, the partitioning unit or positional encoder may alternatively be defined as a group of function modules, where the function modules are implemented as a computer program running on at least one processor.

The computer program residing in memory may thus be organized as appropriate function modules configured to perform, when executed by the processor, at least part of the steps and/or tasks described herein. An example of such function modules is illustrated in FIG. 12.

Figure 12:
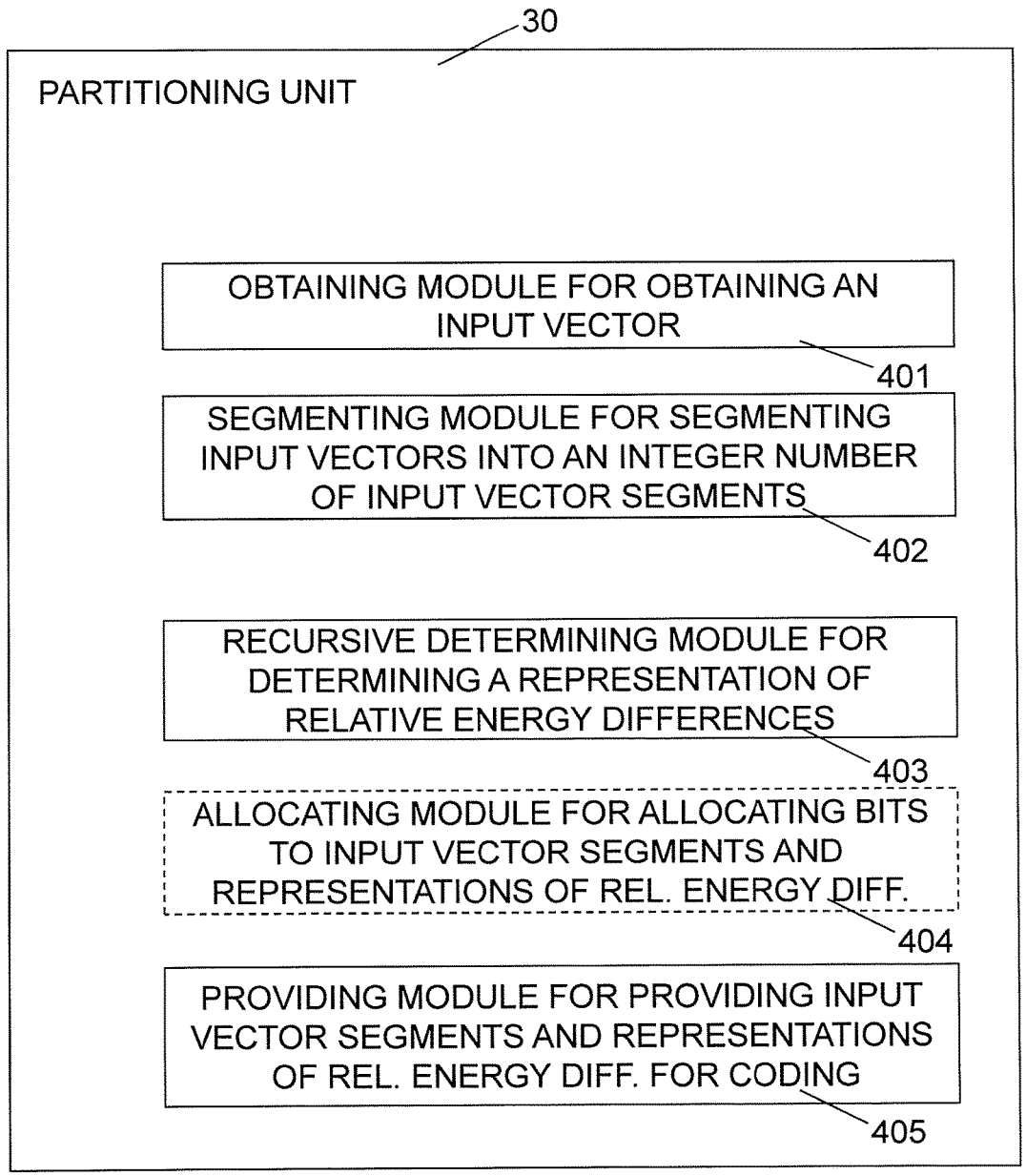
FIG. 12 is a block diagram of an embodiment of a partitioning unit.

FIG. 12 is a schematic block diagram illustrating an example of an apparatus for partitioning of input vectors for coding, preferably positional coding, or partitioning unit 30 comprising a group of function modules. The partitioning unit 30 comprises an obtaining module 401 for obtaining an input vector. The partitioning unit 30 comprises a segmenting module 402 for segmenting, in a non-recursive manner, the input vector into an integer number, $N^{SEG}$, of input vector segments. The partitioning unit 30 comprises a recursive determining module 403 for determining, in a recursive manner, a representation of a respective relative energy difference between parts of the input vector on each side of each boundary between the input vector segments. The partitioning unit 30 comprises a providing module 405 for providing the input vector segments and representations of the relative energy differences for individual coding, preferably individual positional coding.

Preferably, the apparatus for partitioning is configured for positional encoding of audio signals, i.e. where the input vector represents an audio signal to be encoded. However, the ideas presented here also operate well for e.g. video signal as well.

In a particular embodiment, the partitioning unit 30 also comprises an allocating module 404 for allocating bits to input vector segments and for a representation of the relative energy differences between lower level segments.

Alternatively it is possibly to realize the modules in FIG. 12 predominantly by hardware modules, or alternatively by hardware. The extent of software versus hardware is purely an implementation selection.

It should also be noted that the units or modules described in this disclosure are to be regarded as logical entities and not with necessity as separate physical entities. It will be appreciated that the scope of the technology disclosed herein fully encompasses other embodiments which may become obvious to those skilled in the art, and that the scope of this disclosure is accordingly not to be limited.

Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed hereby. Moreover, it is not necessary for a device or method to address each and every problem sought to be solved by the technology disclosed herein, for it to be encompassed hereby.

In the preceding description, for purposes of explanation and not limitation, specific details are set forth such as particular architectures, interfaces, techniques, etc. in order to provide a thorough understanding of the disclosed technology. However, it will be apparent to those skilled in the art that the disclosed technology may be practiced in other embodiments and/or combinations of embodiments that depart from these specific details. That is, those skilled in the art will be able to devise various arrangements which, although not explicitly described or shown herein, embody the principles of the disclosed technology. In some instances, detailed descriptions of well-known devices, circuits, and methods are omitted so as not to obscure the description of the disclosed technology with unnecessary detail. All statements herein reciting principles, aspects, and embodiments of the disclosed technology, as well as specific examples thereof, are intended to encompass both structural and functional equivalents thereof. Additionally, it is intended that such equivalents include both currently known equivalents as well as equivalents developed in the future, e.g. any elements developed that perform the same function, regardless of structure.

Thus, for example, it will be appreciated by those skilled in the art that the figures herein can represent conceptual views of illustrative circuitry or other functional units embodying the principles of the technology, and/or various processes which may be substantially represented in computer readable medium and executed by a computer or processor, even though such computer or processor may not be explicitly shown in the figures.

The functions of the various elements including functional blocks may be provided through the use of hardware such as circuit hardware and/or hardware capable of executing software in the form of coded instructions stored on computer readable medium. Thus, such functions and illustrated functional blocks are to be understood as being either hardware-implemented and/or computer-implemented, and thus machine-implemented.

The embodiments described above are to be understood as a few illustrative examples of the present invention, and it should be understood that the proposed technology is not limited thereto. It will be understood by those skilled in the art that various modifications, combinations and changes may be made to the embodiments without departing from the scope of the present invention. In particular, different part solutions in the different embodiments can be combined in other configurations, where technically possible.

ABBREVIATIONS

ASIC Application Specific Integrated Circuit
$B^E$ bits for coding the energy ratio
$B^{SEG}$ bits per segment
$B^{SH}$ bits for shape vector corresponding to certain energy ratio
$B^{TOT}$ total available bit budget
CD Compact Disc
CPU Central Processing Unit
DSP Digital Signal Processor
DVD Digital Versatile Disc
E energy per segment on one level
FPC Factorial Pulse Coding
FPGA Field Programmable Gate Array
HDD Hard Disk Drive
L length (dimension) of the input vector
$L^{SEG}$ length (dimension) of a segment
LEE Laptop Embedded Equipment
LME Laptop Mounted Equipment
$N^{SEG}$ number of segments
PC Personal Computer
PDA Personal Digital Assistant
PLC Programmable Logic Controller
PVQ Pyramid Vector Quantization
$Q^{MAX}$ maximum allowed bits per-quantizer
R energy ratio between neighboring segments on one level
RAM Random Access Memory
ROM Read-Only Memory
UE User Equipment
USB Universal Serial Bus

The invention claimed is:

1. A method for partitioning of input vectors for encoding of an audio signal, wherein the method comprises the steps of:
obtaining the audio signal;
obtaining an input vector for use in encoding at least a portion of the audio signal;
segmenting, in a non-recursive manner, the input vector into an integer number, $N^{SEG}$, of input vector segments;
determining energy ratios in a recursive manner, wherein each determined energy ratio represents a ratio between energies of a left level segment of the input vector and a right level segment of the input vector; and
providing the input vector segments and the energy ratios for individual coding, wherein
the step of determining the energy ratios in a recursive manner comprises:
a) dividing the input vector into: 1) a first left level segment of the input vector and 2) a first right level segment of the input vector, wherein the first left level segment of the input vector comprises one or more of the input vector segments and the first right level segment of the input vector comprises a different one or more of the input vector segments;
b) determining E0, wherein E0 represents an energy of the first left level segment of the input vector;
c) determining E1, wherein E1 represents an energy of the first right level segment of the input vector; and
d) calculating a first energy ratio ($R_0$) representing a ratio between energies of the first left level segment and the first right level segment, wherein calculating the first energy ratio ($R_0$) comprises calculating E1/E0, and
the method further comprises
determining a number of bits ($B_0^{SEG}$) to allocate for the first left level segment in dependence on i) a ratio between the length of the first left level segment ($L_0^{SEG}$) and the length of the first right level segment ($L_1^{SEG}$) and ii) the first energy ratio ($R_0$); and
allocating the determined number of bits ($B_0^{SEG}$) for the first left level segment.

2. The method according to claim 1, wherein the integer number, $N^{SEG}$, is the smallest integer number by which each the input vector segment fulfils constraints associated with a quantizer for the coding.

3. The method according to claim 1, wherein the input vector segments have identical lengths or a respective length differing by not more than 1.

4. The method according to claim 3, wherein the first $N^{SEG}-1$ input vector segments have identical lengths.

5. The method according to claim 3, wherein all input vector segments have lengths not differing by more than 1.

6. The method according to claim 1, wherein the step of determining the energy ratios further comprises:
determining that the first right level segment comprises more than one input vector segment;
as a result of determining that the first right level segment comprises more than one input vector segment, dividing the first right level segment into a second left level segment and a second right level segment; and
calculating a second energy ratio representing a ratio between energies of the second left level segment and the second right level segment.

7. The method according to claim 6, wherein the second left level segment is not equal in size to the second right level segment.

8. The method according to claim 6, further comprising allocating bits for coding of each the input vector segment.

9. The method according to claim 8, wherein the step of allocating bits is performed in connection to the step of determining the energy rations in a recursive manner.

10. The method according to claim 6, further comprising allocating bits for coding of each the input vector segment.

11. The method according to claim 1, wherein allocating bits determining the number of bits ($B_0^{SEG}$) to allocate for the first left level segment in dependence on i) a ratio between the length of the first left level segment ($L_0^{SEG}$) and the length of the first right level segment ($L_1^{SEG}$) and ii) the first energy ratio ($R_0$) comprises determining the number of bits ($B_0^{SEG}$) for the first left level segment according to:

$$B_0^{SEG} = \frac{B^{SEG} + (f_1 + f_0)L_1^{SEG} - \frac{1}{2}\log_2(R_0)L_1^{SEG}}{1 + \frac{L_1^{SEG}}{L_0^{SEQ}}},$$

wherein $f_0$ and $f_1$ are compensation factors and $B^{SEG}$ is the number of available bits for shape coding the first left level segment and the first right level segment.

12. The method according to claim 11, wherein the compensation factors are dependent on lengths of input vector segments, the number of input vector segments within both lower level input vectors and bits allocated for both lower level input vectors.

13. The method according to claim 12, wherein the compensation factors are dependent on at least average bits per input vector segment within both lower level input vectors, the input vector segment lengths and a minimum lower level input vector length.

14. A partitioning unit, the partitioning unit being configured to:
obtain an input vector for use in encoding at least a portion of an audio signal;
segment, in a non-recursive manner, the input vector into an integer number, $N^{SEG}$, of input vector segments;
determine energy ratios in a recursive manner, wherein each determined energy ratio represents a ratio between energies of a left level segment of the input vector and a right level segment of the input vector; and
provide the input vector segments and the energy ratios for individual coding, wherein
the partitioning unit is configured to determine the energy ratios in a recursive manner by performing a process comprising:
a) dividing the input vector into: 1) a first left level segment of the input vector and 2) a first right level segment of the input vector, wherein the first left level segment of the input vector comprises one or more of the input vector segments and the first right level segment of the input vector comprises a different one or more of the input vector segments;
b) determining E0, wherein E0 represents an energy of the first left level segment of the input vector;
c) determining E1, wherein E1 represents an energy of the first right level segment of the input vector; and
d) calculating a first energy ratio ($R_0$) representing a ratio between energies of the first left level segment and the first right level segment, wherein calculating the first energy ratio comprises calculating E1/E0, and
the partitioning unit is further configured to:
determine a number of bits ($B_0^{SEG}$) to allocate for the first left level segment in dependence on i) a ratio between the length of the first left level segment ($L_0^{SEG}$) and the length of the first right level segment ($L_1^{SEG}$) and ii) the first energy ratio ($R_0$); and
allocate the determined number of bits ($B_0^{SEG}$) for the first left level segment.

15. The partitioning unit of claim 14, wherein the partitioning unit comprises a processor and a memory, the memory comprising instructions executable by the processor, whereby the processor is operative to determine the energy ratios in a recursive manner.

16. The partitioning unit of claim 14, wherein the integer number, $N^{SEG}$, is the smallest integer number by which each the input vector segment fulfils constraints associated with a quantizer for the coding.

17. The partitioning unit according to claim 14, wherein the input vector segments have identical lengths or a respective length differing by not more than 1.

18. The partitioning unit according to claim 17, wherein the first $N^{SEG}-1$ input vector segments have identical lengths.

19. The partitioning unit according to claim 17, wherein all input vector segments have lengths not differing by more than 1.

20. The partitioning unit according to claim 14, wherein the process further comprises:
determining that the first right level segment comprises more than one input vector segment;
as a result of determining that the first right level segment comprises more than one input vector segment, dividing the first right level segment into a second left level segment and a second right level segment; and
calculating a second energy ratio representing a ratio between energies of the second left level segment and the second right level segment.

21. The partitioning unit according to claim 20, wherein the second left level segment is not equal in size to the second right level segment.

22. The partitioning unit according to claim 20, wherein the partitioning unit is further configured to allocate bits for coding of each the input vector segment.

23. The partitioning unit according to claim 22, wherein the partitioning unit is configured to perform the allocating of bits in connection to the determining the energy ratios in a recursive manner.

24. The partitioning unit according to claim 14, wherein the partitioning unit is further configured to allocate bits for coding of each the input vector segment.

25. The partitioning unit according to claim 14, wherein allocating bits for the first left level segment in dependence on i) a ratio between the length of the first left level segment ($L_0^{SEG}$) and the length of the first right level segment ($L_1^{SEG}$) and ii) the first energy ratio ($R_0$) comprises allocating the bits for the first left level segment according to:

$$B_0^{SEG} = \frac{B^{SEG} + (f_1 - f_0)L_1^{SEG} - \frac{1}{2}\log_2(R_0)L_1^{SEG}}{1 + \frac{L_1^{SEG}}{L_0^{SEQ}}},$$

wherein $f_0$ and $f_1$ are compensation factors and $B^{SEG}$ is the number of available bits for shape coding the first left level segment and the first right level segment.

26. The partitioning unit according to claim 25, wherein the compensation factors are dependent on lengths of input vector segments, the number of input vector segments within both lower level input vectors and bits allocated for both lower level input vectors.

27. The partitioning unit according to claim 26, wherein the compensation factors are dependent on at least average bits per input vector segment within both lower level input vectors, the input vector segment lengths and a minimum lower level input vector length.

28. An encoder for positional encoding, comprising an input unit configured to receive an input vector representing a signal, a partitioning unit according to claim 14, a quantizer and an output unit for an encoded signal.

29. A non-transitory computer readable medium comprising a computer program comprising instructions, which when executed by at least one processor, causes the at least one processor to:
obtain an input vector for use in encoding at least a portion of an audio signal;
segment, in a non-recursive manner, the input vector into an integer number, $N^{SEG}$, of input vector segments;

determine energy ratios in a recursive manner, wherein each determined energy ratio represents a ratio between energies of a left level segment of the input vector and a right level segment of the input vector; and provide the input vector segments and the energy ratios for individual coding, wherein the computer program causes the processor to determine the energy ratios in a recursive manner by causing the processor to perform a process comprising:

a) dividing the input vector into: 1) a first left level segment of the input vector and 2) a first right level segment of the input vector, wherein the first left level segment of the input vector comprises one or more of the input vector segments and the first right level segment of the input vector comprises a different one or more of the input vector segments;

b) determining E0, wherein E0 represents an energy of the first left level segment of the input vector;

c) determining E1, wherein E1 represents an energy of the first right level segment of the input vector; and d) calculating a first energy ratio representing a ratio between energies of the first left level segment and the first right level segment, wherein calculating the first energy ratio comprises calculating E1/E0, and the computer program further causes the processor to:

determine a number of bits ($B_0^{SEG}$) to allocate for the first left level segment in dependence on i) a ratio between the length of the first left level segment ($L_0^{SEG}$) and the length of the first right level segment ($L_1^{SEG}$) and ii) the first energy ratio ($R_0$); and allocate the determined number of bits ($B_0^{SEG}$) for the first left level segment.

30. An apparatus for partitioning of input vectors for coding, wherein the apparatus comprises:

an obtaining module for obtaining an input vector for use in encoding at least a portion of an audio signal;

a segmenting module for segmenting, in a non-recursive manner, the input vector into an integer number, $N^{SEG}$, of input vector segments;

a determining module for determining energy ratios in a recursive manner, wherein each determined energy ratio represents a ratio between energies of a left level segment of the input vector and a right level segment of the input vector; and a providing module for providing the input vector segments and the energy ratios for individual coding, wherein the determining module is configured to determine the energy ratios in a recursive manner by performing a process comprising:

a) dividing the input vector into: 1) a first left level segment of the input vector and 2) a first right level segment of the input vector, wherein the first left level segment of the input vector comprises one or more of the input vector segments and the first right level segment of the input vector comprises a different one or more of the input vector segments;

b) determining E0, wherein E0 represents an energy of the first left level segment of the input vector;

c) determining E1, wherein E1 represents an energy of the first right level segment of the input vector; and d) calculating a first energy ratio representing a ratio between energies of the first left level segment and the first right level segment, wherein calculating the first energy ratio comprises calculating E1/E0, and the apparatus further comprises a bit allocating configured to:

i) determine a number of bits ($B_0^{SEG}$) to allocate for the first left level segment in dependence on i) a ratio between the length of the first left level segment ($L_0^{SEG}$) and the length of the first right level segment ($L_1^{SEG}$) and ii) the first energy ratio ($R_0$); and ii) allocate the determined number of bits ($B_0^{SEG}$) for the first left level segment.

* * * * *

UNITED STATES PATENT AND TRADEMARK OFFICE
CERTIFICATE OF CORRECTION

PATENT NO. : 10,320,413 B2
APPLICATION NO. : 14/421680
DATED : June 11, 2019
INVENTOR(S) : Jansson Toftgard et al.

It is certified that error appears in the above-identified patent and that said Letters Patent is hereby corrected as shown below:

In the Specification

In Column 8, Line 45, delete "log 2" and insert -- $\log_2$ --, therefor.

In the Claims

In Column 18, Line 50, in Claim 9, delete "rations" and insert -- ratios --, therefor.

In Column 18, Lines 53-54, in Claim 11, delete "wherein allocating bits determining" and insert -- wherein determining --, therefor.

In Column 18, Lines 61-63, in Claim 11, delete " $B_0^{SEG} = \dfrac{B^{SEG} + (f_1 + f_0)L_1^{SEG} - \frac{1}{2}\log_2(R_0)L_1^{SEG}}{1 + \dfrac{L_1^{SEG}}{L_0^{SEQ}}}$ " and insert -- $B_0^{SEG} = \dfrac{B^{SEG} + (f_1 - f_0)L_1^{SEG} - \frac{1}{2}\log_2(R_0)L_1^{SEG}}{1 + \dfrac{L_1^{SEG}}{L_0^{SEG}}}$ --, therefor.

Signed and Sealed this
Eighth Day of October, 2019

Andrei Iancu
*Director of the United States Patent and Trademark Office*